(12) United States Patent
Renz et al.

(10) Patent No.: US 6,952,099 B2
(45) Date of Patent: Oct. 4, 2005

(54) MAGNETIC RESONANCE APPARATUS WITH AN ADHESIVELY ATTACHED GRADIENT COIL SYSTEM

(75) Inventors: Wolfgang Renz, Erlangen (DE); Johann Schuster, Oberasbach (DE); Stefan Stocker, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 80 days.

(21) Appl. No.: 10/678,903

(22) Filed: Oct. 3, 2003

(65) Prior Publication Data

US 2005/0040826 A1 Feb. 24, 2005

(30) Foreign Application Priority Data

Oct. 4, 2002 (DE) .......................... 102 46 308

(51) Int. Cl.⁷ ................................. G01V 3/00
(52) U.S. Cl. ..................... 324/318; 324/319
(58) Field of Search ................ 324/318, 319, 324/320, 322, 300, 306, 307, 309; 600/421, 422

(56) References Cited

U.S. PATENT DOCUMENTS

| | | | |
|---|---|---|---|
| 5,331,281 A | * | 7/1994 | Otsuka ...................... 324/318 |
| 5,332,972 A | * | 7/1994 | Takenouchi ................ 324/318 |
| 5,409,558 A | | 4/1995 | Takahasi et al. |
| 5,559,435 A | | 9/1996 | Harada |
| 5,570,021 A | | 10/1996 | Dachniwskyj et al. |
| 5,574,084 A | | 11/1996 | Peacock |
| 5,630,415 A | | 5/1997 | Kaufman |
| 5,698,980 A | | 12/1997 | Sellers et al. |
| 6,075,363 A | | 6/2000 | Sellers et al. |
| 6,107,799 A | | 8/2000 | Sellers et al. |
| 6,441,614 B1 | * | 8/2002 | Edelstein et al. .......... 324/318 |
| 6,531,870 B2 | | 3/2003 | Heid et al. |

FOREIGN PATENT DOCUMENTS

EP 0 362 931 4/1990

* cited by examiner

*Primary Examiner*—Louis Arana
(74) *Attorney, Agent, or Firm*—Schiff Hardin LLP

(57) ABSTRACT

A magnetic resonance device has a gradient coil system, with an adhesive introduced between the gradient coil system and the rest of the magnetic resonance device to attach the gradient coil system to the rest of the magnetic resonance device.

17 Claims, 3 Drawing Sheets

MAGNETIC RESONANCE APPARATUS WITH AN ADHESIVELY ATTACHED GRADIENT COIL SYSTEM

BACKGROUND OF THE INVENTION

1. Field of the Invention

The invention concerns a magnetic resonance device of the type having a cavity and with a gradient coil system arranged in the cavity.

2. Description of the Prior Art

Magnetic resonance technology is a known technology for, among other things, acquiring images of the inside of a body of an examination subject. In a magnetic resonance device, rapidly switched gradient fields that are generated by a gradient coil system are superimposed on a static basic magnetic field that is generated by a basic field magnet. The magnetic resonance device also has a radio-frequency system that emits radio-frequency signals into the examination subject to excite magnetic resonance signals and acquires the excited magnetic resonance signals, on the basis of which magnetic resonance images are generated.

To generate gradient fields, appropriate currents must be adjusted in gradient coils of the gradient coil system. The amplitudes of the required currents can be up to more than 100 A. The current rise and fall rates can be more than 100 kA/s. The existing basic magnetic field, on the order of 1 T, interacts with these temporally changing currents in the gradient coil to produce Lorentz forces, which leads to oscillations of the gradient coil system. These oscillations are transmitted over various propagation paths at the surface of the magnetic resonance device. The mechanical oscillations are thereby transduced into sound vibrations that subsequently lead to undesired noise. Furthermore, the Lorentz forces can lead to an undesired rigid-body motion (resonance) of the gradient coil system with regard to the rest of the magnetic resonance device.

A magnetic resonance device is known from German OS 197 22 481 in which a basic field magnet has a first surface and a gradient coil system has a second surface, the surfaces facing one another being separated from one another, and a noise reduction device is arranged in contact with both surfaces to damp the oscillations of the gradient coil system and/or to stiffen or reinforce the gradient coil system. In an embodiment, to form a closed, sealed space between the two surfaces, the noise reduction device has suitable seals, this space being filled with sand, foam, a fluid under pressure, or other oscillation-damping and/or stiffening materials. In another embodiment, the noise reduction device has a number of cushions that can be filled with one of the aforementioned materials. In another embodiment, in a basic field magnet having a cylindrical, hollow opening, in which a hollow-cylindrical gradient coil system is arranged, the noise reduction device is formed by wedges that are distributed between the two surfaces.

A magnetic resonance device with a gradient coil system is known from German OS 101 56 770, in which an electrically conductive structure is arranged and fashioned such that a magnetic field of the structure caused by a gradient field by induction is similar to the gradient field, at least within the imaging volume of the magnetic resonance device. In an embodiment, a part of the structure is fashioned substantially barrel-shaped as a component of the basic field magnet. Among other things, the gradient coil system can be fashioned without shielding coils, since the undesired consequences of the switched gradient fields, due to the similarity of the magnetic field caused by the structure, can be completely controlled by a pre-emphasis (pre-distortion/deformation).

SUMMARY OF THE INVENTION

It is an object of the present invention to provide an improved magnetic resonance device in which, among other things, reduced noise emission is achieved.

The object is inventively achieved in a magnetic resonance device with a gradient coil system, wherein an adhesive is introduced between the gradient coil system and the rest of the magnetic resonance device to attach the gradient coil system to the rest of the magnetic resonance device.

A connection is achieved via the adhesive between the rest of the magnetic resonance device (as one assembly part) and the gradient coil system (as another assembly part) via surface bonding and also internal stiffness, thus by adhesion as well as cohesion, that imparts to the connected unit a significant stiffness and thus (among other things) enables a quiet operation of the magnetic resonance device.

In an embodiment, the adhesive is a material with a low melting temperature, in particular a wax such as stearin, paraffin, or carnauba wax, with a melting temperature between 50° C. and 90° C. Reversible and non-destructive installation and removal of the gradient coil system thus are achieved by a simple temperature control of the adhesive.

DESCRIPTION OF THE PREFERRED EMBODIMENTS

Figure 1:
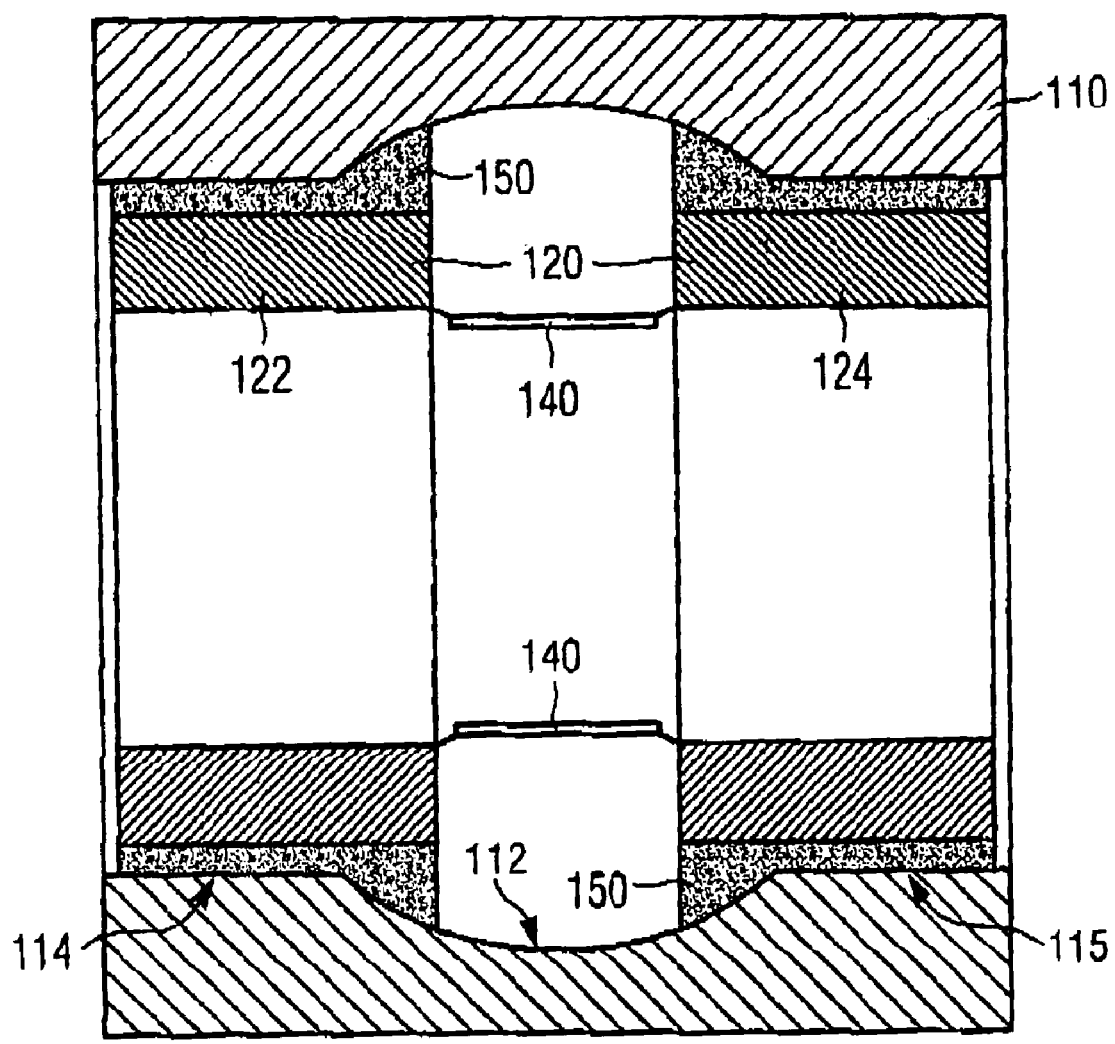
FIG. 1 is a longitudinal section through a magnetic resonance device in accordance with the invention, in which a gradient coil system, formed by two hollow cylinder-shaped halves, is attached by an adhesive in a cavity (having a barrel-shaped middle region) of a basic field magnet.

FIG. 1 shows as an exemplary embodiment of the invention a longitudinal section through a magnetic resonance device. To generate a static basic magnetic field, the magnetic resonance device has a superconducting basic field magnet 110 with a cavity that is barrel-shaped in a middle region 112 and is cylindrically fashioned in edge regions 114 and 115 that connect to both sides of the middle region 112. The basic field magnet 10 is assigned, for example, corresponding to the above-cited German OS 101 56 770. A two-part gradient coil system 120 is mounted in the cavity of the basic field magnet 110 to generate gradient fields. The gradient coil system 120 is formed by two halves 122 and 124, between which a specially fashioned antenna system 140 is arranged to transmit radio-frequency signals and to receive magnetic resonance signals. The halves 122 and 124 respectively contain parts of the sub-coils of the gradient coils of the gradient coil system.

An adhesive 150 that connects the gradient coil system 120 with the basic field magnet 110 by surface bonding is introduced between the outer generated surface of both halves 122 and 124 and the surface of the basic field magnet 110 directly facing them. Adhesives of various types (also polyurethane foams) can be used as the adhesive 150. Physically setting adhesives (for wet bonding, contact bonding, activated bonding and pressure sensitive bonding) and chemically setting adhesives (for reaction bonding, containing chemically hardening adhesives, for example a hardening resin) are suitable. The halves 122 and 124 are attached in the basic field magnet 110 over a large surface and with positive fit, such that a longer and safer operation of the magnetic resonance device with simultaneously less noise emission is ensured with the stiffened installation of the gradient coil system 120 in the basic field magnet 110. The above-described installation (achieving a particularly high stiffness) of the gradient coil system 120 can be used in a gradient coil system that is not actively shielded, for example according to the concept described in German OS 101 56 770. In contrast to an actively shielded gradient coil system, the comparable inventive gradient coil system that is not actively shielded seen as a whole exhibits (due to the nonexistent shielding coils) a lesser innate stiffness, and given approximately the same large Lorentz forces, a greater noise emission would be expected without the counteracting measures of the particularly stiff installation in the non-actively shielded gradient coil system.

Figure 2:
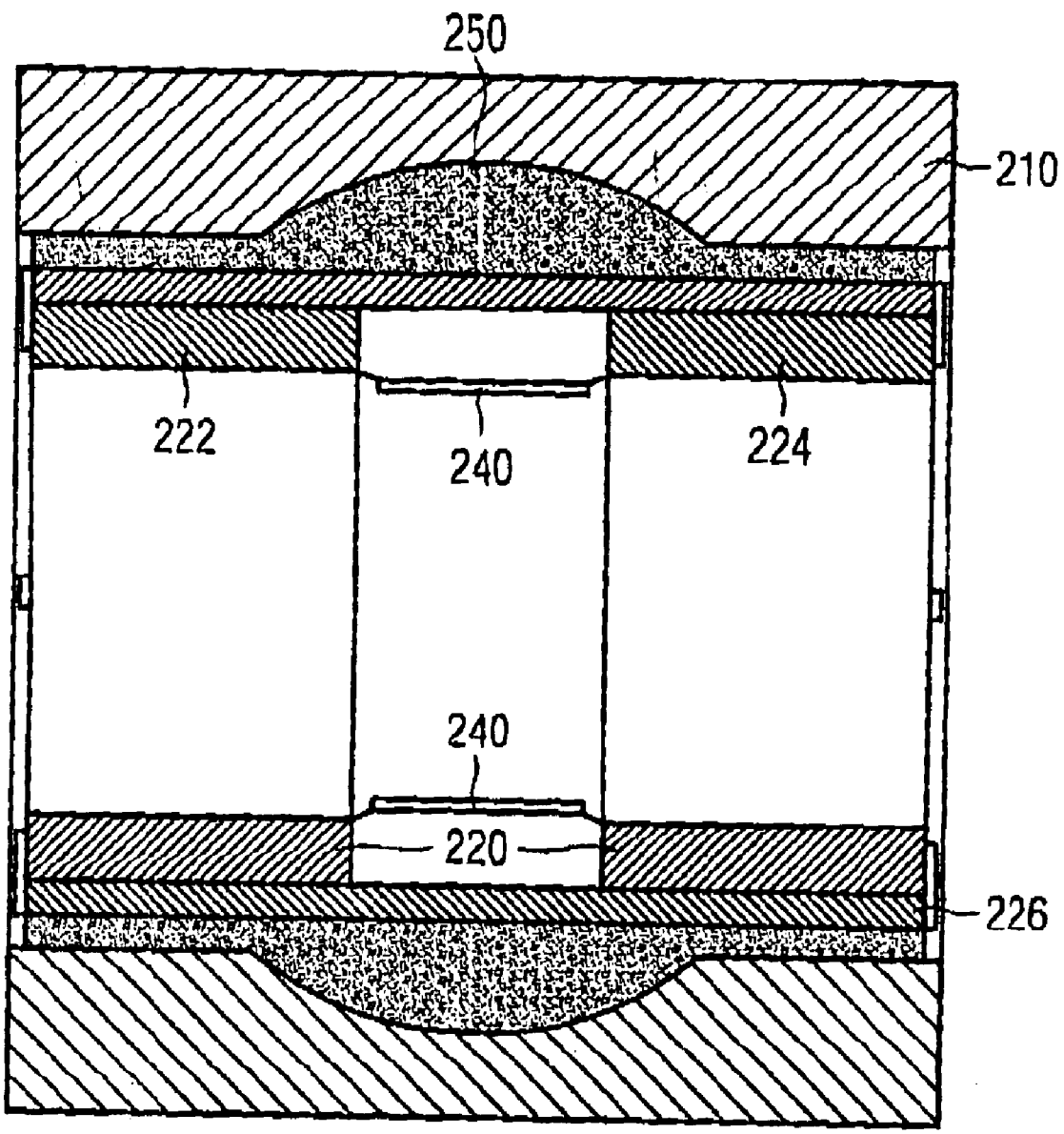
FIG. 2 is a longitudinal section through a magnetic resonance device in accordance with the invention, in which a hollow cylinder-shaped carrier of a gradient coil system is attached by an adhesive in a cavity (having a barrel-shaped middle region) of a basic field magnet.

FIG. 2 shows as an exemplary embodiment of the invention a longitudinal section through a further magnetic resonance device. The magnetic resonance device has a superconducting basic field magnet 210 that is designed corresponding to the basic field magnet 110 of the magnetic resonance device of FIG. 1. Furthermore, the magnetic resonance device of FIG. 2 has a gradient coil system 220 formed by two hollow cylinder-shaped halves 222 and 224, similar to those of the gradient coil system 120 of FIG. 1. Corresponding to FIG. 1, an antenna system 240 is specially fashioned for arrangement between the two halves 222 and 224.

Differing from the embodiment of FIG. 1, both halves 222 and 224 are not directly connected with the basic field magnet 210 via an adhesive, but rather both halves 222 and 224 are first attached to a carrier 226, shaped like a hollow cylinder of the gradient coil system 220. This carrier 226 is then (corresponding to the description associated with FIG. 1) attached in the basic field magnet 210 by application of an adhesive 250 between the external surface of the carrier 226 and a surface of the basic field magnet 210 facing it. In the embodiment corresponding to FIG. 2, an even stiffer installation of the gradient coil system 220 is achieved via the use of the carrier 226 fashioned mechanically stiff than in the exemplary embodiment according to FIG. 1. The aforementioned advantages thus are achieved an even greater extent in the embodiment of FIG. 2. In contrast to the embodiment according to FIG. 1, however, the carrier 226 requires additional installation volume.

Compared to the inventive arrangement, in a conventional installation of the gradient coil system 220, that for example is attached only via aforementioned wedges (corresponding to German OS 197 22 481) an oscillation of the gradient coil system 220 with lower damping and thus higher noise emission must be expected due to the gradient coil system 220 being formed in the middle only by the carrier 226 (and thus being mechanically weak there). Furthermore, the antenna system 240 attached between the units 222 and 224 could thereby be damaged or completely destroyed due to the severe relative motions of the two units 222 and 224.

Figure 3:
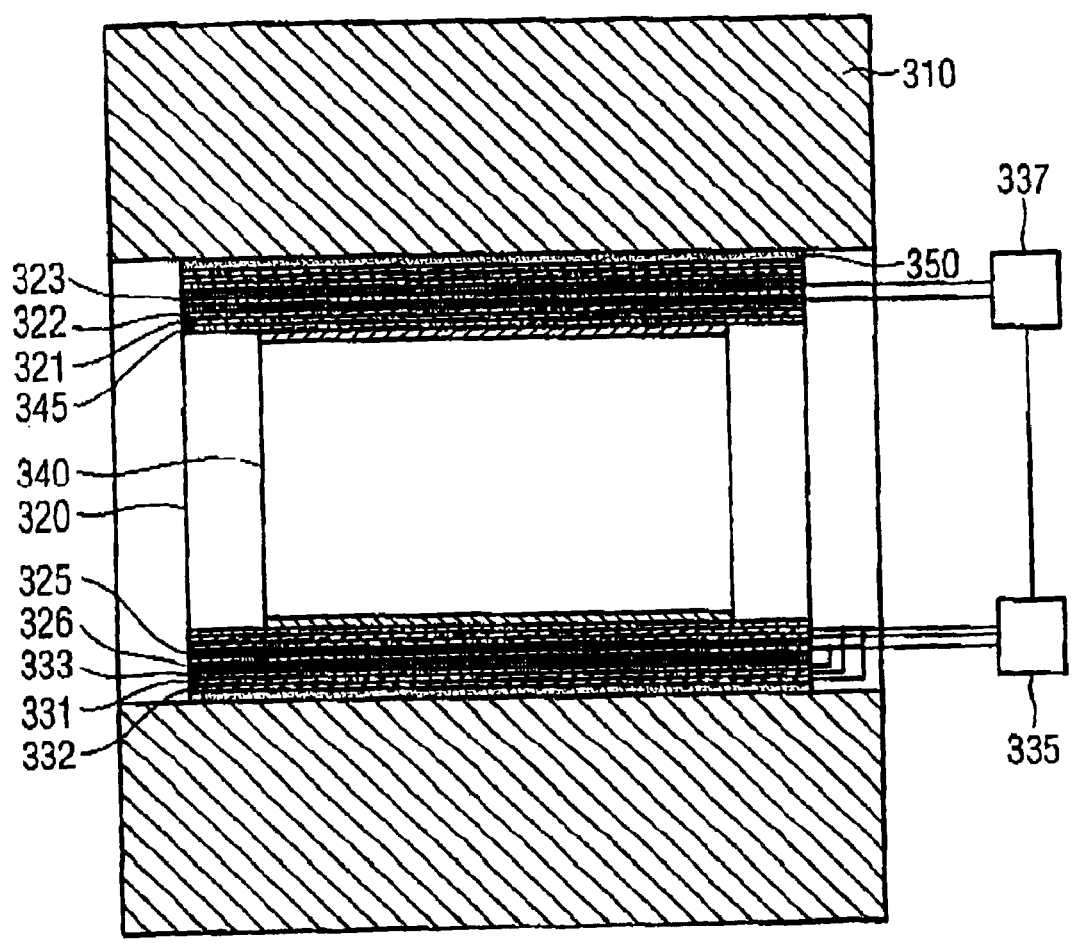
FIG. 3 is a longitudinal section through a magnetic resonance device in accordance with the invention, in which a hollow cylinder-shaped gradient coil system is releasably attached by an adhesive in a cylindrical cavity of a basic field magnet.

FIG. 3 shows, as a further exemplary embodiment of the invention, a longitudinal section through a magnetic resonance device. A superconducting basic field magnet 310 of the magnetic resonance device is fashioned with a cylindrical cavity. A substantially hollow cylinder-shaped, cast resin-encapsulated gradient coil system 320 is arranged in the cavity. The gradient coil system 320 has from the inside out, the following hollow cylinder-shaped regions 321 through 333, that are arranged concentric to one another: a first region 321 comprises a first transversal gradient coil and a second region 322 with a second transversal gradient coil. The transversal gradient coils are each composed of four saddle-shaped sub-coils. A third region 325 contains a coolant device to cool the gradient coils. A fourth region 323 has a longitudinal gradient coil formed by two solenoid sub-coils. A fifth region 326 has active and/or passive shim devices and a further cooling device. In a sixth region 333, a shielding coil is arranged associated with the longitudinal gradient coil. A seventh region 331 has a further shielding coil associated with the first transversal gradient coil, and an eighth region 332 has a further shielding coil associated with the second transversal gradient coil.

To control electrical currents in the coils, they are connected with a gradient control unit 335, and to control a coolant flow in the coolant device these are connected with a cooling control unit 337. The shielding coils associated with the gradient coils are designed and can have current supplied to them such that the magnetic fields that are generated with the shielding coils are at least compensated with magnetic fields that are generated with the appertaining gradient coils on a cryo-shield of the basic field magnet 310, such that fewer eddy currents are induced in the cryo-shield via the gradient coil system 320 to which current is applied, compared to a gradient coil system without shielding coils.

With the gradient coil system 320 to which current is applied, magnetic gradient fields that are rapidly switched can be superimposed inside an imaging volume of the magnetic resonance device. So that the switched gradient fields in the imaging volume are not distorted by eddy current induction and thus associated eddy current magnetic fields, it is operated by the gradient control unit 335 with corresponding pre-emphasized (pre-distorted) control factors for the currents of the gradient coils and appertaining shielding coils.

Furthermore, the magnetic resonance device has an antenna system 340 to radiate radio-frequency signals into an examination subject positioned in the imaging volume, as well as to acquire magnetic resonance signals from the examination subject. A radio-frequency shield 345 is thereby arranged between the antenna system 340 and the gradient coil system 320 to shield from external interfering influences.

The gradient coil system 320 is attached in the cavity of the basic field magnet 310 by an adhesive 350 introduced between an external cylinder jacket of the gradient coil system 320 and a surface of the basic field magnet 310 directly facing it that achieves a suitable surface bonding between the surfaces facing each other of both aforementioned components of the magnetic resonance device. The adhesive 350 has a melting temperature between approximately 50° C. and 90° C. A wax or a similarly melting material can be used as the adhesive 350. The melting temperature is determined by the type of wax or wax mixture used. Stearin, paraffin, or the very hard carnauba wax (that melts at a somewhat higher temperature) are suitable wax types. To produce the connection between the gradient coil system 320 and the basic field magnet 310, the space to be filled between the two aforementioned components of the magnetic resonance device is sealed, and the adhesive 350

(brought by warming to a fluid or viscous state) is poured in. For a proper flow, during the pouring at least the surfaces of both aforementioned components facing one another are preheated. After cooling, a planar and firm connection arises between the gradient coil system 320 and the basic field magnet 310.

In normal operation of the magnetic resonance device, it is ensured by suitable adjustments of the gradient control unit 335 and the cooling control unit 337 that a temperature on the outer jacket of the carrier gradient coil system 320 is sufficiently for from the melting point of the wax. To detect the temperature, the temperature probe that is usually arranged anyway in the gradient coil system 320 can thereby be used. Due to the comparatively high weight of the cast resin-encapsulated gradient coil system 320, in an embodiment a mechanical securing of the gradient coil system 320 in the cavity of the basic field magnet 310 additionally can be used, for example with wedges corresponding to the above-cited German OS 197 22 481, in order to prevent the possibility of a slow migration of the wax.

For non-destructive removal of the units gradient coil system 320 from the cavity of the basic field magnet 310, it is merely necessary to heat the outer jacket of the gradient coil system 320 above the melting point of the adhesive 350. For this purpose, the gradient control unit 335 and the cooling control unit 337 are operable such that suitable currents in the gradient coils and shielding coils are set with a reduced cooling. In other embodiments, the gradient coil system 320 is provided with an additional heating device, or the cooling devices and the cooling control unit 337 are fashioned such that they can be operated with a coolant that can be heated in above the relevant melting temperature. Due to the temperature increase at the outer jacket (surface) of the gradient coil system 320, the adhesive 350 melts in the region around the external jacket, such that a slick film exists that additionally eases the removal of the gradient coil system 320. This feature, indicated in FIG. 3, of being able to reversibly and non-destructively install and remove the gradient coil system 320, can be used to particular advantage in the case of an exchange of the gradient coil system 320, for example, to install, as needed, a higher-capacity gradient coil system and/or given the necessity of a removal for repair work and/or maintenance work.

Although modifications and changes may be suggested by those skilled in the art, it is the intention of the inventors to embody within the patent warranted hereon all changes and modifications as reasonably and properly come within the scope of their contribution to the art.

We claim:

1. A magnetic resonance apparatus comprising:
a magnetic resonance scanner having a surface therein;
a gradient coil system disposed in said scanner; and
an adhesive disposed between said gradient coil system and said surface attaching said gradient coil system to said scanner, said adhesive having a melting temperature in a range between approximately 50° C. and 90° C.

2. A magnetic resonance apparatus as claimed in claim 1 wherein said gradient coil system has a surface facing said surface of said scanner, and wherein said adhesive is disposed between said surface of said scanner and said surface of said gradient coil system.

3. A magnetic resonance apparatus as claimed in claim 1 wherein said surface of said scanner forms a cavity in which said gradient coil system is disposed and attached.

4. A magnetic resonance apparatus as claimed in claim 3 wherein said cavity is cylindrical.

5. A magnetic resonance apparatus as claimed in claim 3 wherein said cavity has a middle region with a barrel shape.

6. A magnetic resonance apparatus as claimed in claim 1 wherein said gradient coil system comprises a plurality of gradient coils each formed by multiple sub-coils, and wherein respective parts of said sub-coils are respectively disposed in two structurally separate halves of said gradient coil system.

7. A magnetic resonance apparatus as claimed in claim 6 wherein said surface of said scanner forms a cavity in which said gradient coil system is disposed and attached, said cavity having a middle region with a barrel shape, and said halves being separated from each other and respectively disposed at opposite sides of said middle region.

8. A magnetic resonance apparatus as claimed in claim 7 wherein said gradient coil system comprises a carrier on which said halves are mounted separated from each other.

9. A magnetic resonance apparatus as claimed in claim 8 wherein said halves and said carrier each have a hollow cylindrical shape.

10. A magnetic resonance apparatus as claimed in claim 1 wherein said scanner comprises a basic field magnet having said surface to which said gradient coil system is attached.

11. A magnetic resonance apparatus as claimed in claim 1 wherein said adhesive is selected from the group consisting of hard foams and adhesive resins.

12. A magnetic resonance apparatus as claimed in claim 1 wherein said adhesive is a wax.

13. A magnetic resonance apparatus as claimed in claim 12 wherein said wax is selected from the group consisting of steam, paraffin and carnauba wax.

14. A magnetic resonance apparatus comprising:
a magnetic resonance scanner having a surface therein;
a gradient coil system disposed in said scanner;
an adhesive disposed between said gradient coil system and said surface attaching said gradient coil system to said scanner, said adhesive having a low melting temperature; and
said gradient coil system comprising at least one coil and a control unit connected to said at least one coil for controlling a quantity flowing in said coil to set a temperature of said gradient coil system, during operation of said scanner to acquire magnetic resonance data, that is below said melting temperature of said adhesive, said control unit also controlling said quantity to selectively increase said temperature of said gradient coil system above said melting temperature of said adhesive, allowing release of the attachment of said gradient coil system to said scanner.

15. A magnetic resonance apparatus as claimed in claim 14 wherein said gradient coil system comprises a plurality of gradient coils and wherein said at least one coil is at least one of said gradient coils, and wherein said quantity is current.

16. A magnetic resonance apparatus as claimed in claim 14 wherein said gradient coil system comprises a plurality of shielding coils, and wherein said at least one coil is at least one of said shielding coils, and wherein said quantity is current.

17. A magnetic resonance apparatus as claimed in claim 14 wherein said gradient coil system comprises a cooling coil and wherein said at least one coil is said cooling coil, and wherein said quantity is a fluid coolant.

* * * * *